(12) United States Patent
Obana et al.

(10) Patent No.: US 12,022,174 B2
(45) Date of Patent: Jun. 25, 2024

(54) ELECTRONIC DEVICE AND ELECTRONIC DEVICE SYSTEM

(71) Applicant: CANON KABUSHIKI KAISHA, Tokyo (JP)

(72) Inventors: Shinji Obana, Tokyo (JP); Hideaki Momose, Kanagawa (JP); Kanae Nakamori, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 344 days.

(21) Appl. No.: 17/376,972

(22) Filed: Jul. 15, 2021

(65) Prior Publication Data
US 2022/0030150 A1 Jan. 27, 2022

(30) Foreign Application Priority Data

Jul. 22, 2020 (JP) .................................. 2020-125162

(51) Int. Cl.
| | |
|---|---|
| H05K 7/20 | (2006.01) |
| G03B 17/56 | (2021.01) |
| H04N 23/52 | (2023.01) |
| H05K 1/02 | (2006.01) |

(52) U.S. Cl.
CPC ........... H04N 23/52 (2023.01); H05K 1/0209 (2013.01); H05K 7/20172 (2013.01); H05K 7/2039 (2013.01)

(58) Field of Classification Search
CPC .. H04N 23/52; H05K 1/0209; H05K 7/20172; H05K 7/2039
USPC ........................................................ 361/688
See application file for complete search history.

(56) References Cited

U.S. PATENT DOCUMENTS

| | | | | | |
|---|---|---|---|---|---|
| 5,704,212 | A | * | 1/1998 | Erler ........................ | F25B 21/04 361/679.48 |
| 5,898,569 | A | * | 4/1999 | Bhatia ..................... | G06F 1/203 361/679.48 |
| 5,948,086 | A | * | 9/1999 | Lin ....................... | H04N 1/2112 348/E5.025 |
| 5,959,836 | A | * | 9/1999 | Bhatia ..................... | G06F 1/203 361/679.48 |
| 5,974,556 | A | * | 10/1999 | Jackson ................ | G06F 1/3203 327/512 |
| 6,084,769 | A | * | 7/2000 | Moore .................... | G06F 1/203 361/679.52 |

(Continued)

FOREIGN PATENT DOCUMENTS

| | | |
|---|---|---|
| JP | 2001524265 A | 11/2001 |
| JP | 2005310969 A | 11/2005 |

(Continued)

OTHER PUBLICATIONS

WO-2022201882—English translation (Year: 2022).*

*Primary Examiner* — Anatoly Vortman
(74) *Attorney, Agent, or Firm* — Canon U.S.A., Inc. IP Division

(57) ABSTRACT

An electronic device includes an interface unit including a connection portion attachable to an external device by being connected with an interface terminal disposed in the external device, a heat transfer unit, and a heat dissipation unit, wherein the heat transfer unit and the heat dissipation unit are connected with the interface unit, and are in a direction opposite the external device when the interface unit is connected with the external device.

14 Claims, 11 Drawing Sheets

(56) References Cited

U.S. PATENT DOCUMENTS

| | | | | |
|---|---|---|---|---|
| 6,094,347 | A * | 7/2000 | Bhatia | G06F 1/203 361/679.55 |
| 6,118,654 | A * | 9/2000 | Bhatia | G06F 1/1632 361/679.55 |
| 6,172,871 | B1 * | 1/2001 | Holung | G06F 1/1632 165/104.33 |
| 6,239,970 | B1 * | 5/2001 | Nakai | G06F 1/166 174/15.1 |
| 6,275,945 | B1 * | 8/2001 | Tsuji | G06F 1/203 361/679.48 |
| 6,307,746 | B1 * | 10/2001 | Beckman | G06F 1/203 363/141 |
| 6,313,987 | B1 * | 11/2001 | O'Connor | G06F 1/1632 165/104.33 |
| 6,343,010 | B1 * | 1/2002 | Tanaka | G06F 1/1632 361/679.55 |
| 6,434,001 | B1 * | 8/2002 | Bhatia | G06F 1/203 361/679.48 |
| 6,445,580 | B1 * | 9/2002 | Cohen | H01L 23/38 361/679.47 |
| 6,453,378 | B1 * | 9/2002 | Olson | G06F 1/203 361/679.55 |
| 6,459,575 | B1 * | 10/2002 | Esterberg | G06F 1/203 165/185 |
| 6,560,104 | B2 * | 5/2003 | DeHoff | G06F 1/1632 361/679.55 |
| 6,571,340 | B1 * | 5/2003 | Lee | G06F 1/26 713/300 |
| 6,966,358 | B2 * | 11/2005 | Rapaich | G06F 1/1632 257/E23.098 |
| 7,012,807 | B2 * | 3/2006 | Chu | G06F 1/20 165/80.4 |
| 7,301,767 | B2 * | 11/2007 | Takenoshita | G06F 1/203 60/527 |
| 7,403,384 | B2 * | 7/2008 | Pflueger | H05K 7/20545 361/679.48 |
| 7,472,215 | B1 * | 12/2008 | Mok | G06F 1/3203 361/679.48 |
| 7,872,864 | B2 * | 1/2011 | Mongia | G06F 1/203 361/695 |
| 9,513,667 | B2 * | 12/2016 | Pais | G06F 1/1632 |
| 10,481,656 | B2 * | 11/2019 | Casparian | G06F 1/1632 |
| 10,809,486 | B2 * | 10/2020 | Hosoe | H04N 23/60 |
| 11,190,671 | B2 * | 11/2021 | Wada | H05K 7/20154 |
| 11,310,401 | B2 * | 4/2022 | Makara | H05K 7/20209 |
| 2022/0030150 | A1 * | 1/2022 | Obana | H05K 1/0209 |

FOREIGN PATENT DOCUMENTS

| | | |
|---|---|---|
| JP | 2007088282 A | 4/2007 |
| JP | 2009071516 A | 4/2009 |
| JP | 2019220923 A | 12/2019 |
| WO | WO-2022201882 A1 * | 9/2022 |

* cited by examiner

ELECTRONIC DEVICE AND ELECTRONIC DEVICE SYSTEM

This application claims the benefit of Japanese Patent Application No. 2020-125162, filed Jul. 22, 2020, which is hereby incorporated by reference herein in its entirety.

BACKGROUND OF THE INVENTION

Field of the Invention

The present disclosure relates to an electronic device, especially an electronic device that can be connected with the outside of an image capturing device and can cause the image capturing device to dissipate heat.

Description of the Related Art

In recent years, processing performed by an image capturing device has become complicated, a processing amount performed by a circuit in the image capturing device has increased, and heat generation has been an issue.

To decrease an increase in a temperature of electronic components due to the heat generation, for example, Japanese Patent Application Laid-Open No. 2009-071516 discusses a technique in which a ventilation duct for air cooling is configured in a housing, and a heat dissipation device is attached, and thus heat generation bodies in the housing are forcedly cooled.

In Japanese Patent Application Laid-Open No. 2009-071516, the ventilation duct is formed in an image capturing device, and the ventilation duct is disposed in such a manner that the ventilation duct passes near the heat generation bodies, such as an image sensor. The heat dissipation device equipped with a heat dissipation fan is attached to the image capturing device. Consequently, an air discharge opening in the image capturing device and an air intake opening of the heat dissipation device are attached to be opposite each other. In the image capturing device discussed in Japanese Patent Application Laid-Open No. 2009-071516, the heat dissipation fan is operated to suck outside air from the air intake opening of the image capturing device, and discharge the outside air that has passed near the heat generation bodies and has been warmed from the air discharge opening of the heat dissipation device.

However, in the technique discussed in Japanese Patent Application Laid-Open No. 2009-071516, due to the ventilation duct disposed in the image capturing device, a large space is necessary to dispose the ventilation duct, and downsizing of the image capturing device may be prevented.

SUMMARY OF THE INVENTION

The present disclosure is directed to providing an electronic device of an external connection type that can be connected with an image capturing device.

According to an aspect of the present disclosure, an electronic device includes an interface unit including a connection portion attachable to an external device by being connected with an interface terminal disposed in the external device, a heat transfer unit, and a heat dissipation unit, wherein the heat transfer unit and the heat dissipation unit are connected with the interface unit, and are in a direction opposite the external device when the interface unit is connected with the external device.

Further features of the present disclosure will become apparent from the following description of exemplary embodiments with reference to the attached drawings.

DESCRIPTION OF THE EMBODIMENTS

Appropriate exemplary embodiments of the present disclosure will be described with reference to the drawings.

A first exemplary embodiment will be described with reference to the drawings.

Figure 1A:
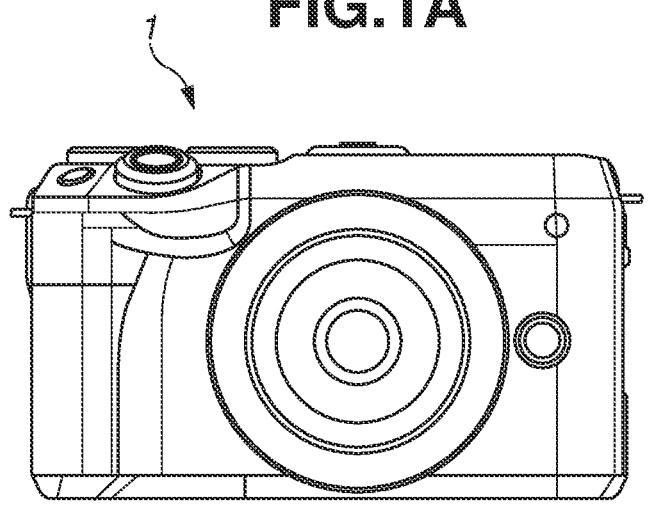
FIGS. 1A to 1C are drawings that illustrate appearance views and a schematic view of an image capturing device according to a first exemplary embodiment of the present disclosure.
Figure 1B:
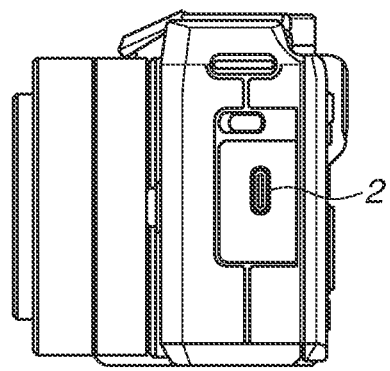
Figure 1C:
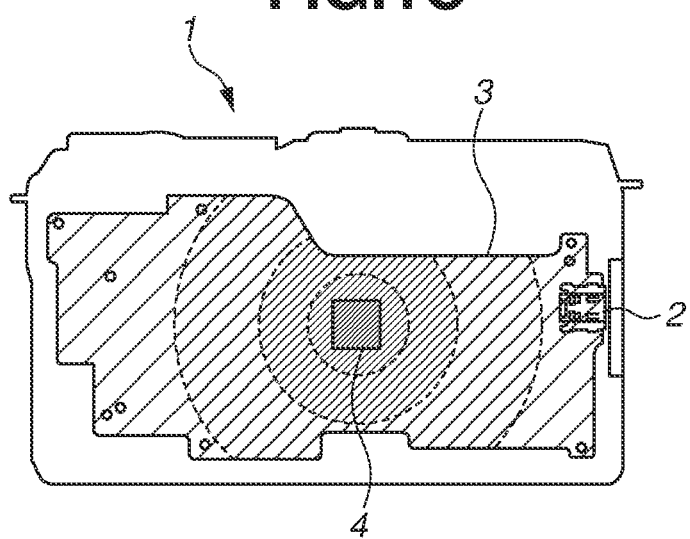

FIGS. 1A to 1C are drawings that illustrate appearance views and a schematic view of an image capturing device 1 according to the present exemplary embodiment. FIG. 1A is a front view of the image capturing device 1. FIG. 1B is a side view of the image capturing device 1. FIG. 1C schematically illustrates the inside of the image capturing device 1.

A lens unit is attached to a main body of the image capturing device 1 according to the present exemplary embodiment. A receptacle connector 2 (interface terminal) is disposed in a side face portion of the main body of the image capturing device 1. The receptacle connector 2 is a connector that enables a mechanical connection and an electrical connection with an external interface. The receptacle connector 2 corresponds to a general-purpose interface. For example, Universal Serial Bus (USB) standard, High-Definition Multimedia Interface (HDMI (registered trademark)) standard, and the like are exemplified. The receptacle connector 2 is attached to a control circuit board 3. In addition to the receptacle connector 2, various electronic components, such as a control integrated circuit (IC) (heat generation electronic component) 4, are attached to the control circuit board 3. The control circuit board 3 controls main operations of the image capturing device 1. If moving images are captured or still images are continuously captured at a high speed by the image capturing device 1, image processing may increase an electrical-signal processing amount. An element package such as a Peltier element of the control IC 4 generates heat. If moving images are captured or still images are continuously captured at a high speed for a long time, a temperature of the control IC 4 becomes high. Heat generated by the control IC 4 travels to a conductor layer, an insulation layer, and the like of the control circuit board 3, and a temperature of the control circuit board 3 increases. In FIG. 1C, a state in which heat generated by the control IC 4 travels to the control circuit board 3 is schematically illustrated with shading of hatching. The heat generated by the control IC 4 also travels to the receptacle connector 2 attached to the control circuit board 3, and a temperature of the receptacle connector 2 increases. If moving image capturing or high-speed continuous capturing of still images continue for a fixed period of time or longer, heat generation electronic components, such as the control IC 4, attached to the control circuit board 3 may reach high temperatures that exceed respective operation guarantee temperatures, and the electronic components and the control circuit board 3 may be damaged. For this reason, some restrictions may be provided for a continuous recording time of motion and the number of still images to be continuously captured at a high speed, and damage due to heat generation may be prevented. The provision of restrictions on operations of the image capturing device 1, however, decreases convenience at the time of usage by a person who captures images. Accordingly, it is preferable that increases in temperatures of heat generation electronic components, such as the control IC 4, are restricted as much as possible, and operation restrictions are not set.

Figure 2A:
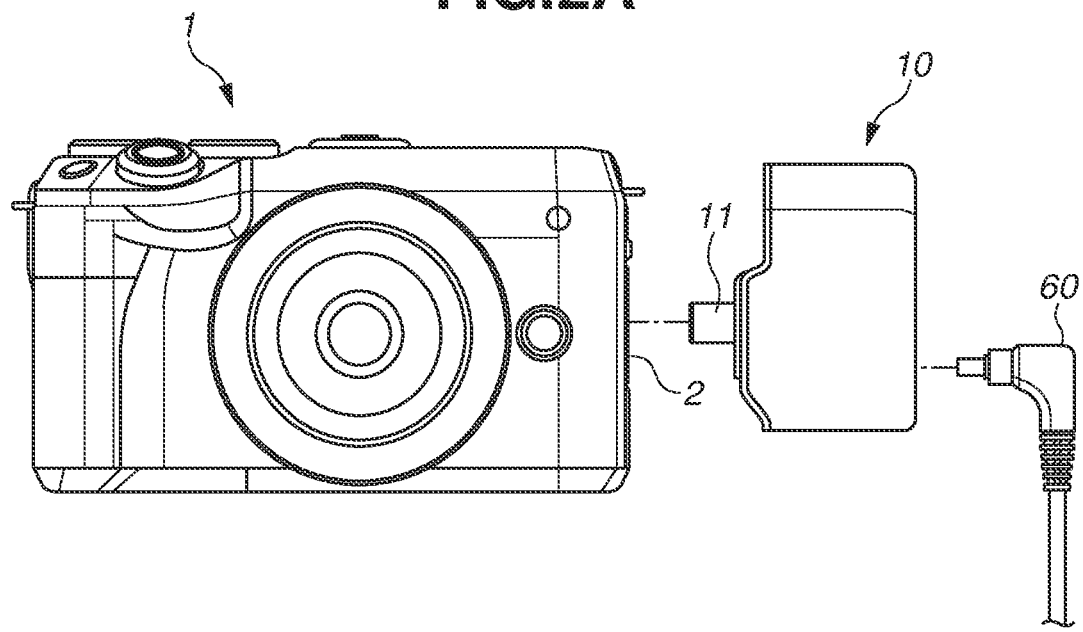
FIGS. 2A and 2B are front views that illustrate attaching an electronic device to the image capturing device according to the first exemplary embodiment of the present disclosure.
Figure 2B:
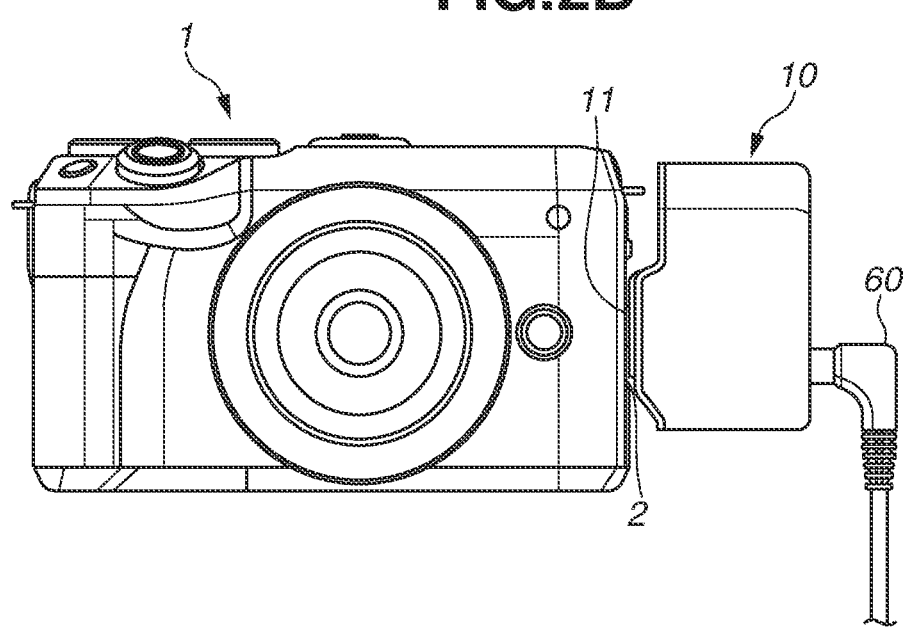

FIGS. 2A and 2B are front views that illustrate attaching an electronic device 10 to the image capturing device 1 according to the present exemplary embodiment. FIG. 2A illustrates a state before the electronic device 10 is attached to the image capturing device 1. FIG. 2B illustrates a state after the electronic device 10 is attached to the image capturing device 1. The electronic device 10 is attachable to the image capturing device 1 that is an external device. Details of an internal configuration of the electronic device 10 will be described below. The electronic device 10 includes a plug 11 (interface unit). The plug 11 is mechanically connectable with (for example, is fitted to) a receptacle connector of a general-purpose interface. The plug 11 has a plug-side shape of an interface standard that is the same as an interface standard of the receptacle connector 2 of the image capturing device 1. The receptacle connector 2 may have a pin jack shape or a female shape, instead of a receptacle shape. The plug 11 may have a header shape or a male shape, instead of a plug-side shape of the same interface standard.

The electronic device 10 can be mechanically connected with the receptacle connector 2. The electronic device 10 is mainly made of metal materials. The electronic device 10 is configured such that a power supply cable 60 can be attached to the electronic device 10. The power supply cable 60 is attached to the electronic device 10, and the other side of the power supply cable 60 is connected with a power supply unit not illustrated, and thus the electronic device 10 is supplied with power. Operations and effects of the electronic device 10 will be described below in detail.

Figure 3A:
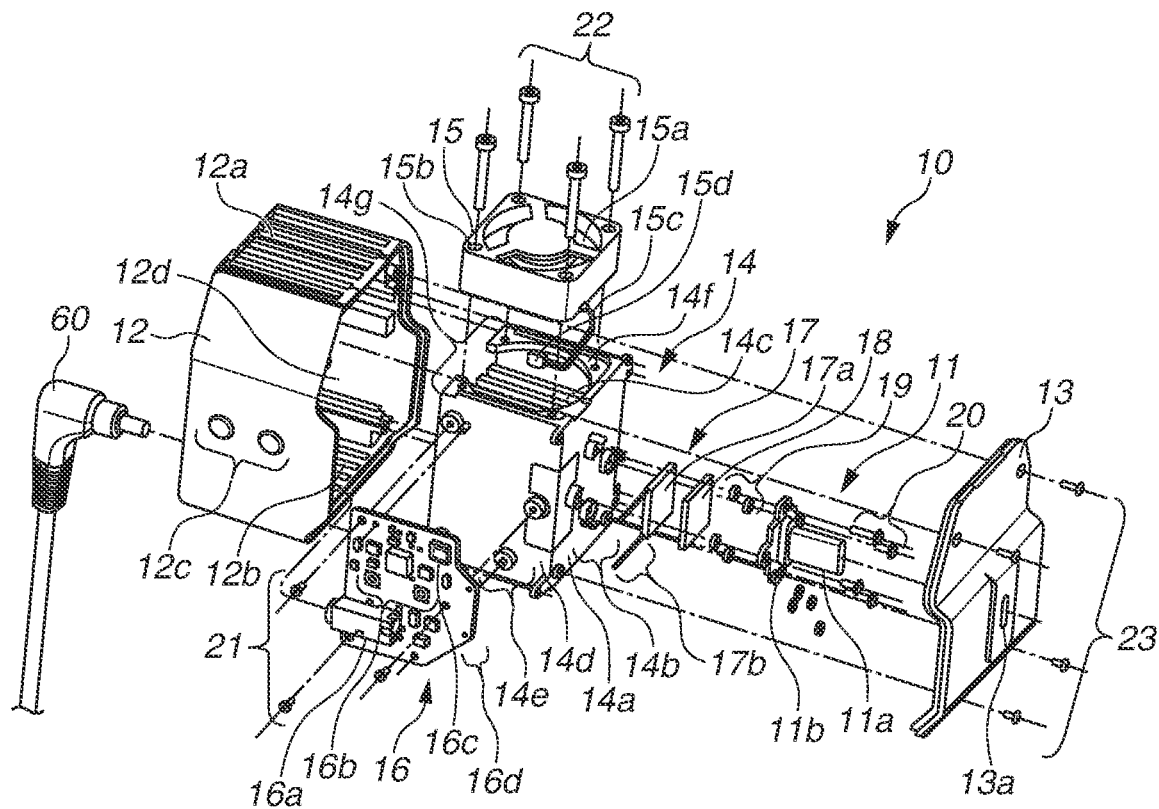
FIGS. 3A and 3B are exploded perspective views that illustrate an internal configuration of the electronic device according to the first exemplary embodiment of the present disclosure.
Figure 3B:
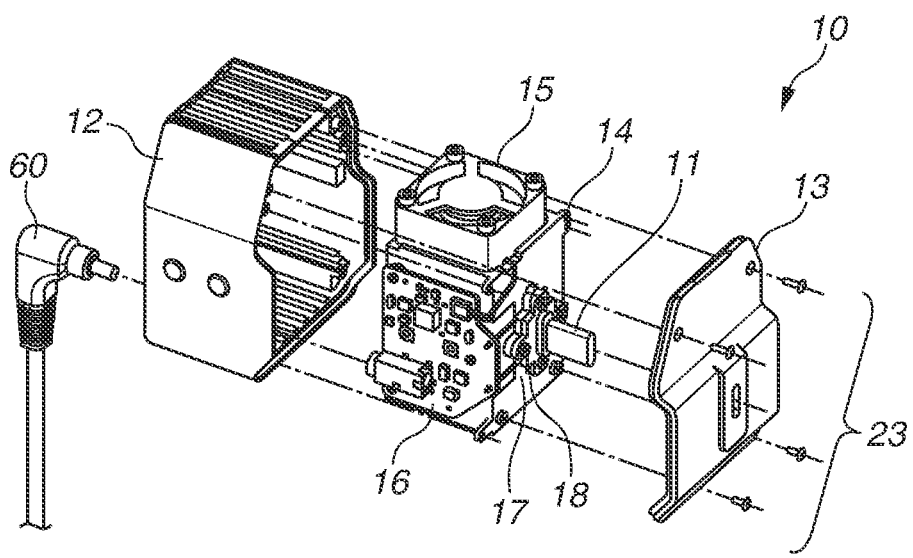

FIGS. 3A and 3B are exploded perspective views that illustrate an internal configuration of the electronic device 10 according to the present exemplary embodiment. The electronic device 10 includes a containing case 12 that contains various components that include the plug 11, and a cover 13 combined with the containing case 12. First, the electronic device 10 includes a heat dissipation fin 14 (heat dissipation unit). The heat dissipation fin 14 includes a fixing portion 14b formed on a main face 14a. The fixing portion 14b mainly includes four screw-fixing holes. A plurality of fins 14c stands from the main face 14a in a direction that is opposite a face where the fixing portion 14b is disposed. For example, the heat dissipation fin 14 is made of an alloy material that includes aluminum, magnesium, and zinc by die casting, and thus the main face 14a, the fixing portion 14b, and the fins 14c are integrally formed. An internal area of the fixing portion 14b is surrounded by the four screw-fixing holes. A Peltier element 17 (heat transfer unit) is disposed in the internal area of the fixing portion 14b. The Peltier element 17 is a semiconductor element that uses the Peltier effect. The Peltier element 17 includes a main-body portion 17a processed into a rectangular shape, and two terminal portions 17b that extend from the main-body portion 17a. Heat transfer rubber 18 (elastic heat transfer unit) is disposed in such a manner that the heat transfer rubber 18 is in contact with the main-body portion 17a. The heat transfer rubber 18 is a rubber sheet that is elastic and has an excellent heat transfer property. The heat transfer rubber 18 includes, for example, a base that includes silicone rubber or the like, and various mixed materials added to the base. An external shape of the heat transfer rubber 18 has been processed into a shape that is substantially the same as a shape of the main-body portion 17a of the Peltier element 17. The heat transfer rubber 18 is stuck to the Peltier element 17. Further, the plug 11 is disposed in such a manner that the plug 11 is in contact with the heat transfer rubber 18. The plug 11 includes a connection portion 11a and a fixing portion 11b. At a time of assembly, the connection portion 11a is exposed from an opening 13a of the cover 13. The fixing portion 11b has a shape like a flat sheet. The fixing portion 11b has four through holes that surround the connection portion 11a. A layout of the through holes is formed to correspond to a layout of the screw-fixing holes of the fixing portion 14b. The Peltier element 17, the heat transfer rubber 18, and the plug 11 are layered, and are closer to the main face 14a of the heat dissipation fin 14 in this order. In a state of the above-described layered layout, four screws 20 are screwed to the screw-fixing holes of the fixing portion 14b from a through hole side of the fixing portion 11b, and the Peltier element 17, the heat transfer rubber 18, and the plug 11 are fixed to and held by the heat dissipation fin 14. Four resin washers 19 are inserted between the fixing portion 11b of the plug 11 and the fixing portion 14b of the heat dissipation fin 14.

The heat dissipation fin 14 includes a fixing portion 14e in a side face 14d that is perpendicular to the main face 14a. The fixing portion 14e mainly includes three screw-fixing holes. A printed circuit board 16 is disposed on the side face 14d, and is fixed and held with three screws 21. Further, the heat dissipation fin 14 includes a fixing portion 14g in a top face 14f. The top face 14f is perpendicular to the main face 14a and the side face 14d. The fixing portion 14g includes four screw-fixing holes. A fan 15 is disposed on the top face 14f. The fan 15 forms a configuration of what is called an axial fan motor. A stator is disposed at the center of a rectangular frame. The stator is equipped with a copper wire coil, and a circuit board that is not illustrated and is electrically connected with various electronic components. A rotor portion includes blades 15a. The blades 15a are equipped with magnets. Corners of the frame have four through holes 15b. Four screws 22 are screwed to the fixing portion 14g from a through hole 15b side of the fan 15 to fix and hold the fan 15. A power supply jack connector 16a is attached to the printed circuit board 16. The power supply jack connector 16a is to be connected with the power supply cable 60. The power supply jack connector 16a supplies power to the printed circuit board 16 from the outside. Further, a tactile switch 16b is attached to the printed circuit board 16. The tactile switch 16b is to be pressed when an operation button 12c formed at the containing case 12 is operated in a state where assembly of the electronic device 10 is completed. The operation button 12c is disposed in such a manner that the operation button 12c faces a person who captures images when the electronic device 10 is attached to the image capturing device 1. The operation button 12c is configured to enable smooth transition from operation of the image capturing device 1 to operation of the electronic device 10. A connector 16c is attached to the printed circuit board 16. The connector 16c is to be electrically connected with the fan 15. A lead 15c extends from a circuit board disposed at a stator portion of the fan 15. A connector 15d on a header side is joined to an end of the lead 15c. The connector 15d conforms to the connector 16c. The fan 15 is operated by a circuit that actuates and controls the fan 15. The circuit that actuates and controls the fan 15 is constituted by various electronic components attached to the printed circuit board 16. The containing case 12 has air discharge openings 12a in a face that is opposite the fan 15. The air discharge openings 12a include a plurality of slits. A face that is opposite the air discharge openings 12a has air intake openings 12b. The air intake openings 12b have a shape of a plurality of slits as similarly as the air discharge openings 12a. When the containing case 12 contains the heat dissipation fin 14, a duct 12d (duct unit) is formed. The duct 12d connects the air discharge openings 12a with the air intake openings 12b. When the fan 15 is actuated, a flow path is formed. The flow path brings in outside air from the air intake openings 12b, enables the outside air to pass the duct 12d and the fins 14c, and discharges the outside air through the air discharge openings 12a. The printed circuit board 16 also includes a conductor land 16d. The conductor land 16d has through holes through which ends of the terminal portions 17b of the Peltier element 17 can be inserted. The Peltier element 17 is preliminarily fixed to and held by the heat dissipation fin 14. Then the terminal portions 17b are inserted into the conductor land 16d, and the printed circuit board 16 is fixed to and held by the heat dissipation fin 14. The terminal portions 17b are electrically connected with the conductor land 16d by soldering or the like. The Peltier element 17 is operated by a circuit that actuates and controls the Peltier element 17. The circuit that actuates and controls the Peltier element 17 is constituted by various electronic components attached to the printed circuit board 16. If the Peltier element 17 operates, a plane side of the Peltier element 17 opposite the heat transfer rubber 18 becomes a heat absorption plane, and a plane side of the Peltier element 17 opposite the heat dissipation fin 14 becomes a heat generation plane. The plug 11 is cooled through the heat transfer rubber 18. On the other hand, heat of the Peltier element 17 is dissipated to the heat dissipation fin 14. When the various components described above have been attached to the heat dissipation fin 14, the heat dissipation fin 14 is fixed to the containing case 12, and further the cover 13 is assembled into, and screws 23 are screwed.

Figure 4:
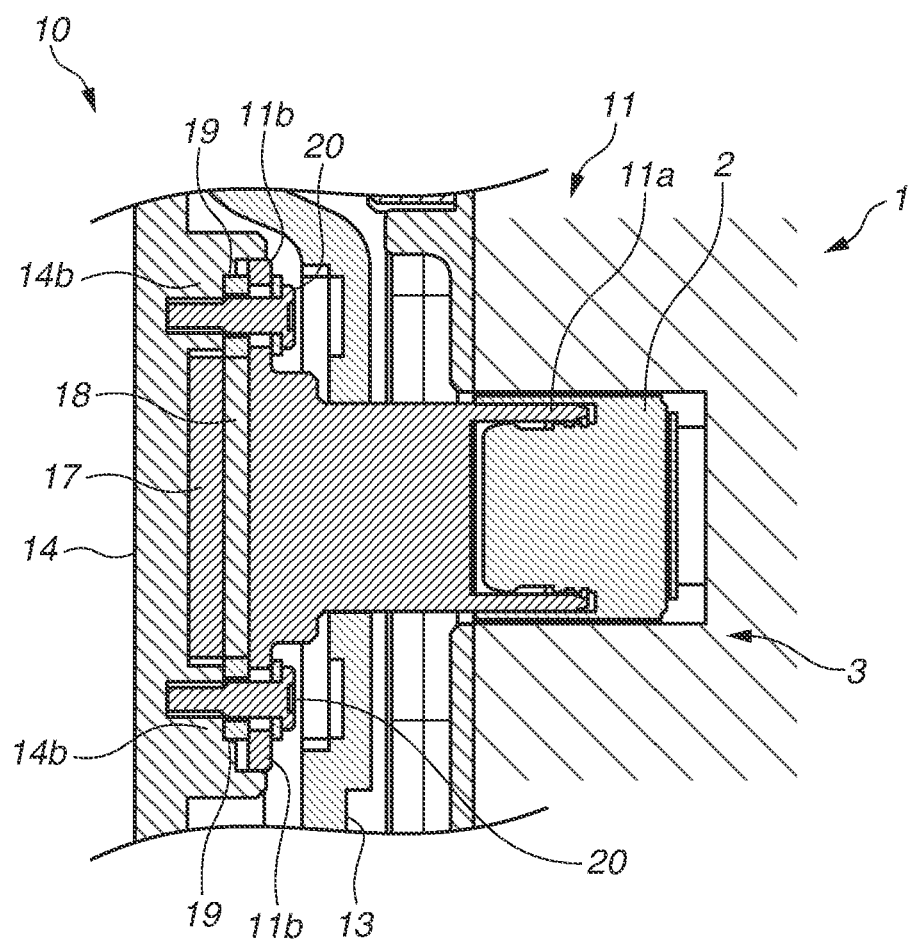
FIG. 4 is a drawing that illustrates a cooling operation of the electronic device according to the first exemplary embodiment of the present disclosure.

FIG. 4 illustrates a cooling operation of the electronic device 10 according to the present exemplary embodiment. FIG. 4 illustrates a cross-sectional view of the electronic device 10 and the image capturing device 1. FIG. 4 illustrates a state in which the electronic device 10 is attached to the image capturing device 1. If the image capturing device 1 continues to be operated for a long time, a temperature of the control IC 4 becomes high. Heat generated by the control IC 4 travels to a conductor layer, an insulation layer, and the like, of the control circuit board 3, and a temperature of the control circuit board 3 increases. Heat generated by the control IC 4 travels to the receptacle connector 2 attached to the control circuit board 3, and a temperature of the receptacle connector 2 increases. If a cooling operation of the electronic device 10 that has been attached is started by operating the operation button 12c, an effect of the Peltier element 17 decreases a temperature of a plane that is in contact with the heat transfer rubber 18. The plug 11 is cooled through the heat transfer rubber 18. The receptacle connector 2 that is physically connected with the plug 11 is also cooled. Then increases in temperatures of the control circuit board 3 and the control IC 4 are restricted, and thus operation restrictions on moving image capturing, high-speed continuous capturing of still images, and the like, of the image capturing device 1 are restricted. In this case, a temperature of a plane of the Peltier element 17 opposite the heat dissipation fin 14 increases. If the temperature increases, operations of the Peltier element 17 become unstable due to heat generation, or a semiconductor and the like that constitute the Peltier element 17 may be damaged. For this reason, a heat generation plane of the Peltier element 17 is made to be in contact with a face of the heat dissipation fin 14, and heat generated in a heat generation plane side of the Peltier element 17 is transferred to the heat dissipation fin 14. The transferred heat travels to the plurality of fins 14c. Further, the fan 15 is actuated to suck outside air, generate an air flow through a flow path formed in the electronic device 10, and discharge warmed air that stays near the fins 14c of the heat dissipation fin 14 to the outside. Performing such operations restricts an increase in a temperature of the heat generation plane side of the Peltier element 17, stabilizes operations of the Peltier element 17, and prevents damage to semiconductors. If heat transferred from a heat generation plane of the Peltier element 17 to the heat dissipation fin 14 is transferred to a heat absorption plane side of the Peltier element 17 through the fixing portion 11b, an effect of operations of the Peltier element 17 that decreases increases in temperatures of the control circuit board 3 and the control IC 4 may be reduced. For this reason, the resin washers 19 are inserted between the fixing portion 11b of the plug 11 and the fixing portion 14b of the heat dissipation fin 14, as described above. Accordingly, heat transferred from a heat generation plane of the Peltier element 17 to the heat dissipation fin 14 is less likely to be transferred to a heat absorption plane side of the Peltier element 17 through the fixing portion 11b. Thus, insertion of the resin washers 19 contributes to enabling a cooling effect of the Peltier element 17 to act more efficiently. For example, resin washers for heat insulation are added between the fixing portion 11b and head bearing surfaces of the screws 20. Consequently, heat that bypasses to a heat absorption plane side of the Peltier element 17 is further decreased.

The receptacle connector 2 includes electronic contacts that enable signal communication with another electronic device. The connection portion 11a of the plug 11 is mainly made of metal materials. However, an insulation resin piece, for example, is inserted into a part of the connection portion 11a that is near an electronic contact portion of the receptacle connector 2, or insulation paint, for example, is applied to the part of the connection portion 11a. Alternatively, a part near the electronic contact portion of the receptacle connector 2 is worked. For example, a gap is secured between a part near the electronic contact portion of the receptacle connector 2 and the electronic contact portion. Consequently, when the electronic device 10 is attached to the image capturing device 1, a short circuit does not occur between the electronic contacts of the receptacle connector 2 through the plug 11. As described above, the heat transfer rubber 18 is disposed between the Peltier element 17 and the plug 11. The heat transfer rubber 18 is fixed and held in a state where the heat transfer rubber 18 is pressed by a fixed amount. If the heat transfer rubber 18 are not provided, and the plug 11 are directly in contact with the Peltier element 17 to cool the plug 11, high surface accuracy of planes of the Peltier element 17 and the plug 11 may be necessary not to allow contact surfaces between the Peltier element 17 and the plug 11 to cause partial contact, line contact, or point contact. Such accurate plane working may cause a decrease in yield of component manufacture and an increase in component cost.

When the electronic device 10 is assembled, an electric screw driver may be used to fix and hold the Peltier element 17 and the plug 11 to the heat dissipation fin 14 with the screws 20. These tools use power of a motor to screw screws, and a shock is caused when a screw is being screwed, or when a screw is completely screwed. If the heat transfer rubber 18 is not provided, and the plug 11 is directly in contact with the Peltier element 17, there is a worry that such a shock may directly travel from the plug 11 that is a rigid body to the Peltier element 17, and thus the Peltier element 17 may be damaged. As a hypothetical configuration in which the heat transfer rubber 18 is not provided, and damage to the Peltier element 17 at a time of assembly is decreased, a configuration in which four coil springs are additionally provided between the fixing portion 11b of the plug 11 and the screws 20, and screw fixing is performed is conceivable, for example. In this case, a shock at a time of screwing is less likely to travel to the Peltier element 17. Work at a time of screw fixing, however, becomes troublesome. If prevention of damage to the Peltier element 17 at a time of assembly, assembly easiness, and stable heat transfer between the Peltier element 17 and the plug 11 are considered, a configuration in which the heat transfer rubber 18 is disposed between the Peltier element 17 and the plug 11 is useful. To perform stable heat transfer, a fixed amount of gap may be formed between a heat generation plane of the Peltier element 17 and the heat dissipation fin 14, and a member that corresponds to the heat transfer rubber 18 may be added to the gap. Alternatively, grease that has a high heat conductivity may be applied between a heat generation plane of the Peltier element 17 and the heat dissipation fin 14.

In a case where the electronic device 10 is attached to the image capturing device 1, and an image is captured while the electronic device 10 is operated, warm air is continuously discharged from the air discharge openings 12a during the image capturing. If the air discharge openings 12a face an object or objects to be captured, the captured object or objects that appear in an angle of view in a macro photography image capturing scene or the like may shake, and intended image capturing may not be performed. If the air discharge openings 12a face a person who captures images, there is a worry that a face or a hand of the person who captures images may continuously exposed to warm air during image capturing, and the warm air may be troublesome. Accordingly, preferably, a direction in which the air discharge openings 12a discharge warm air is parallel to a plane that is orthogonal to an optical axis direction of the image capturing device 1. Warmed air expands, and a weight per unit of volume decreases. Consequently, in a state where a tripod seat faces downward relative to the image capturing device 1, that is to say, in a case where the image capturing device 1 is disposed in a normal position, preferably, an air discharge direction, in which the electronic device 10 attached discharges warm air, is opposite to a vertical direction. Since the air discharge direction is opposite to the vertical direction, an efficient air discharge operation that is not against movement of warm air is performed. That is to say, if a connection portion of an external interface in the image capturing device 1 is disposed in a side face of the housing, as illustrated in FIGS. 1A to 1C and 2A and 2B, preferably, the fins 14c of the heat dissipation fin 14 stand in a direction that is parallel to an attachment direction in which the electronic device 10 is connected. Further, preferably, a plurality of metal sheets that constitutes the fins 14c is disposed in parallel to the vertical direction. Further, a discharge direction of the duct 12d that is opposite to the vertical direction and is linear appropriately acts on a cooling operation.

The electronic device 10 according to the present exemplary embodiment is detachable from the image capturing device 1. The image capturing device 1 is smaller than the image capturing device 1 that hypothetically contains a cooling structure that is similar to the electronic device 10. Since the electronic device 10 is attached to the image capturing device 1 to cool the external interface, downsizing of a main body of the image capturing device 1 is maintained.

A second exemplary embodiment will be described with reference to the drawings. A difference between the second exemplary embodiment and the first exemplary embodiment is that a plug connector 31 (connector structure) instead of the plug 11, and a flexible board 32 are provided. Hereinafter, the second exemplary embodiment will be described, and the difference between the second exemplary embodiment and the first exemplary embodiment will be mainly described. A description of portions of the second exemplary embodiment that are similar to the first exemplary embodiment will be partly omitted.

Figure 5A:
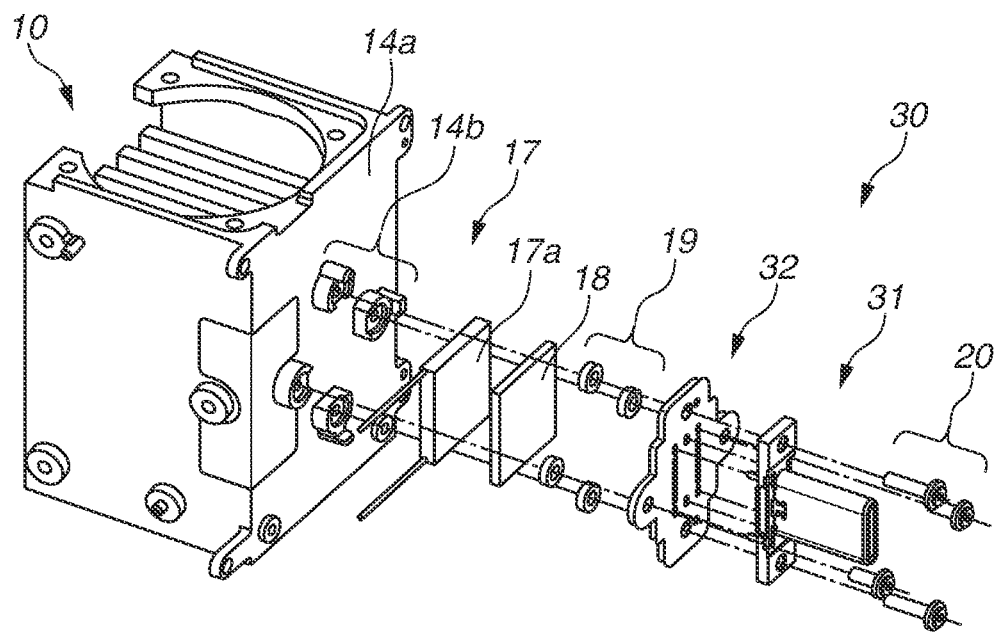
FIGS. 5A and 5B are drawings that illustrate exploded perspective views of an electronic device according to a second exemplary embodiment of the present disclosure.
Figure 5B:
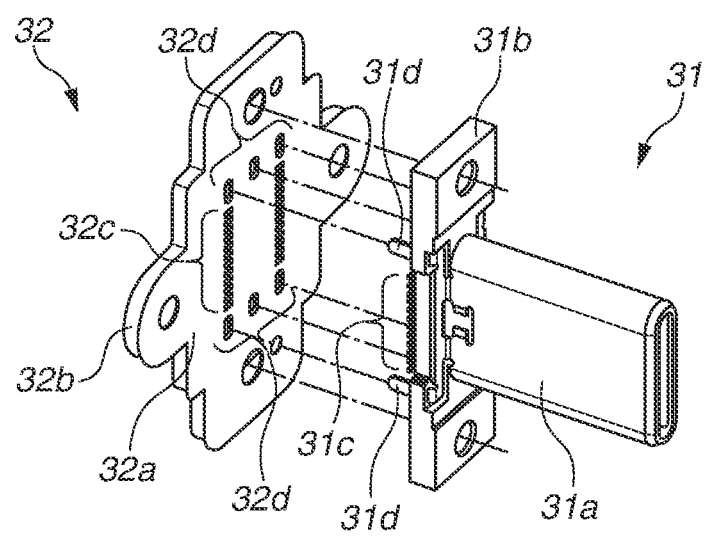

FIGS. 5A and 5B are drawings that illustrate exploded perspective views of an electronic device 30 according to the present exemplary embodiment.

A fixing portion 14b of a heat dissipation fin 14 includes four screw-fixing holes. A Peltier element 17 is disposed in an internal area surrounded by the fixing portion 14b. Heat transfer rubber 18 is disposed in such a manner that the heat transfer rubber 18 is in contact with a main-body portion 17a of the Peltier element 17. An external shape of the heat transfer rubber 18 has been processed into a shape that is substantially the same as a shape of the main-body portion 17a of the Peltier element 17. The heat transfer rubber 18 is stuck to the Peltier element 17. Further, the flexible board 32 is disposed in such a manner that the flexible board 32 is in contact with the heat transfer rubber 18. A plug connector 31 is attached to the flexible board 32. The flexible board 32 mainly includes a copper clad laminate 32a and a reinforcement sheet 32b. The copper clad laminate 32a is a composite material that has a layer structure in which an adhesive layer is formed on a base film that is a film insulator, and a conductor layer is stuck to the adhesive layer. The reinforcement sheet 32b is a metal reinforcement sheet stuck to the copper clad laminate 32a with, for example, heat cure adhesive. The reinforcement sheet 32b includes a material, such as aluminum or stainless steel material (SUS). A conductor layer that constitutes the copper clad laminate 32a has been etched into any pattern shape, and a cover film that has openings that have shapes that are necessary to attach the plug connector 31 is coated. Consequently, a land design on which the plug connector 31 is attached is formed. The land design on which the plug connector 31 is attached mainly includes a surface attachment land 32c (pad portion) and a dual in-line package (DIP) terminal attachment land 32d. The surface attachment land 32c includes a plurality of conductor pads arrayed at regular intervals. To form the DIP terminal attachment land 32d, first, a plurality of conductor pads is formed in the copper clad laminate 32a. The plurality of conductor pads is circular, elliptical, rectangular, or the like. Further, through holes are formed in the conductor pads by punching or the like. The plug connector 31 mainly includes a connection portion 31a (contact terminal portion) and a base portion 31b. The connection portion 31a has a shape that corresponds to a plug-side external shape standard of a general-purpose interface. The base portion 31b is formed by insert molding in such a manner that the base portion 31b is integral with mainly a communication terminal of the connection portion 31a, an insulator that holds the communication terminal, and the like. The base portion 31b is made of a material that resists heat of reflow attachment and the like, such as a heat resistance resin. The base portion 31b also includes surface attachment terminals 31c (attachment terminal portions) electrically connected with the communication terminal of the connection portion 31a, and DIP terminals 31d electrically connected with a metal shell that covers the insulator. A layout of the surface attachment land 32c and the DIP terminal attachment land 32d that are formed on the flexible board 32 is formed at positions that correspond to a layout of the surface attachment terminals 31c and the DIP terminals 31d of the plug connector 31. The DIP terminals 31d are inserted into through holes of the DIP terminal attachment land 32d, the plug connector 31 is mounted on the flexible board 32, and the lands is connected with the terminals with an electrical-joint material, such as solder. The flexible board 32 also includes four through holes that surround a land portion on which the plug connector 31 is attached. A layout of the through holes is formed to correspond to a layout of the screw-fixing holes of the fixing portion 14b of the heat dissipation fin 14. In a state where the Peltier element 17, the heat transfer rubber 18, the flexible board 32, and the plug connector 31 are layered, and are closer to a main face 14a of the heat dissipation fin 14 in this order, four screws 20 are screwed from a through hole side of the flexible board 32 to the screw-fixing holes of the fixing portion 14b, and the Peltier element 17, the heat transfer rubber 18, the flexible board 32, and the plug connector 31 are fixed to and held by the heat dissipation fin 14. In this case, four resin washers 19 are inserted between the reinforcement sheet 32b of the flexible board 32 and the fixing portion 14b of the heat dissipation fin 14. The electronic device 30 also includes the containing case 12, the cover 13, the fan 15, the printed circuit board 16, and the like that have been described in the first exemplary embodiment. The features and shapes of the components are the same as the contents described in the first exemplary embodiment, and will not be described in detail.

Figure 6A:
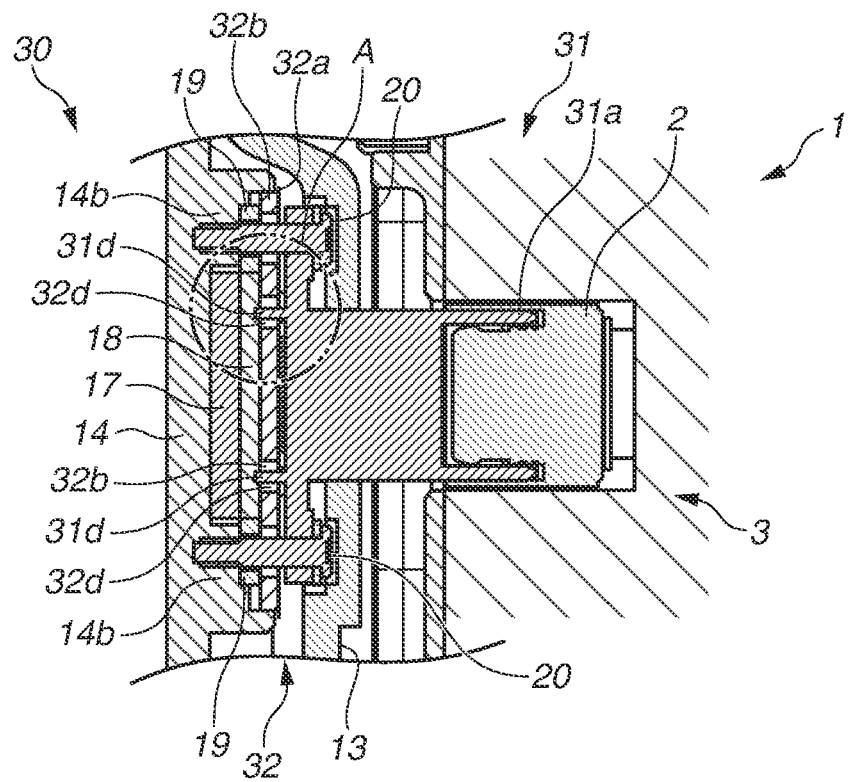
FIGS. 6A and 6B are cross-sectional views that illustrate a state where the electronic device according to the second exemplary embodiment of the present disclosure is attached to an image capturing device.
Figure 6B:
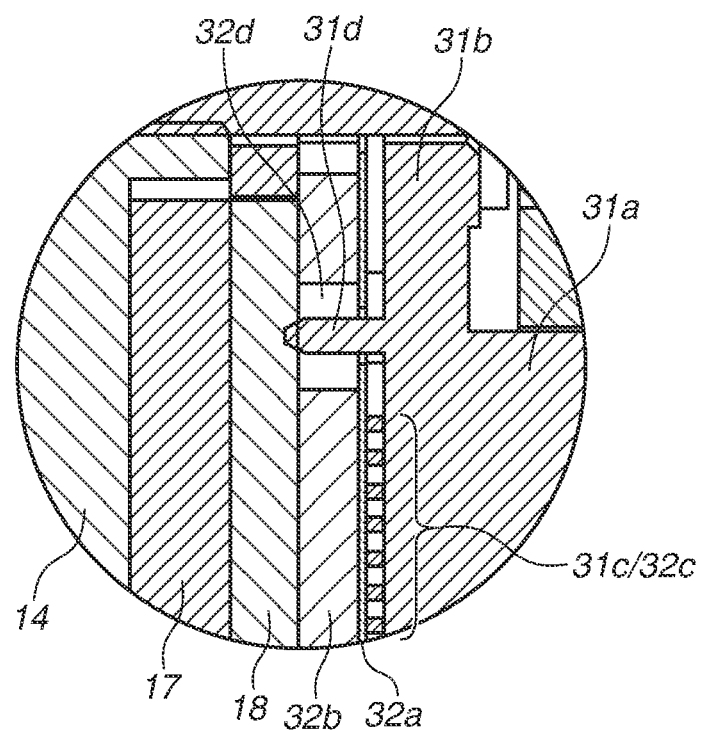

FIGS. 6A and 6B are cross-sectional views that illustrate a state where the electronic device 30 according to the present exemplary embodiment is attached to the image capturing device 1. FIG. 6A illustrates a whole state where the electronic device 30 according to the present exemplary embodiment is attached to the image capturing device 1. FIG. 6B illustrates an enlarged view of an area A in FIG. 6A. Hereinafter, a cooling operation of the electronic device 30 according to the present exemplary embodiment will be described with reference to FIGS. 6A and 6B.

As similarly as the first exemplary embodiment, if the image capturing device 1 operates for a long time, a temperature of a control IC 4 becomes high. Heat generated by the control IC 4 travels to a conductor layer, an insulation layer, and the like, of a control circuit board 3, and a temperature of the control circuit board 3 increases. Heat generated by the control IC 4 also travels to a receptacle connector 2 attached to the control circuit board 3, and a temperature of the receptacle connector 2 increases. If a temperature of the receptacle connector 2 increases in a state where the electronic device 30 is attached, a temperature of the plug connector 31 connected with the receptacle connector 2 increases. If a temperature of the plug connector 31 increases, temperatures of a conductor layer of the copper clad laminate 32a, the reinforcement sheet 32b made of metal, and the like, of the flexible board 32 increase. Starting a cooling operation of the electronic device 30 cools a heat absorption plane side of the Peltier element 17 due to an effect of the Peltier element 17. The heat transfer rubber 18 that is in contact with a heat absorption plane is also cooled. The reinforcement sheet 32b is cooled through the heat transfer rubber 18, and the copper clad laminate 32a that includes a metal conductor layer is also cooled. The plug connector 31 joined to the flexible board 32 by soldering is also cooled. Then, an increase in a temperature of the receptacle connector 2 connected with the plug connector 31 is decreased, the decreased temperature of the receptacle connector 2 travels to the control circuit board 3, and an increase in a temperature of the control IC 4 is decreased. Accordingly, starts of operation restrictions in a case where moving images are captured, still images are continuously captured at a high speed, or the like, by the image capturing device 1 are restricted. In the configuration of the present exemplary embodiment, in an orientation in which the plug connector 31 is attached to the flexible board 32, ends of the DIP terminals 31d project by a small amount from through holes of the reinforcement sheet 32b. In such a configuration, when the plug connector 31 is assembled to the Peltier element 17 and the heat transfer rubber 18, the ends of the DIP terminals 31d directly press opposite portions of the heat transfer rubber 18. In an area where the DIP terminals 31d are directly in contact with the heat transfer rubber 18, the heat transfer rubber 18 cooled by an operation of the Peltier element 17 directly cools the plug connector 31 not through the flexible board 32. Due to the reason described above, the electronic device 30 contributes to a more efficient decrease in an increase in a temperature on an image capturing device 1 side.

The first exemplary embodiment uses a configuration in which a connection portion with the image capturing device 1 is the plug 11, and the plug 11 is integrally formed by cutting or the like. A component cost of the plug 11 may be increased. On the other hand, in the present exemplary embodiment, the electronic device 30 includes a general-purpose plug interface connector that is relatively easily obtained. Easiness of obtaining is good, and a component cost is reduced. In the above description, the flexible board 32 that includes the reinforcement sheet 32b that is made of metal and is stuck is used as a circuit board on which the plug connector 31 is attached. The exemplary embodiment is not limiting, but various changes to shapes and changes are possible within a scope of the gist. For example, a rigid printed circuit board that includes a rigid substrate, such as glass epoxy, as a base may be used instead of the flexible board 32. In this case, a resist coating that coats a conductor layer of the rigid printed circuit board that is a front layer on a plane side that is in contact with the heat transfer rubber 18 is removed, and thus the conductor layer is directly in contact with the heat transfer rubber 18. consequently, heat travel to the heat transfer rubber 18 is increased.

In the present exemplary embodiment, a general-purpose plug interface connector is used. For this reason, an electronic device that is for cooling, has a lower component cost, and is in contact with the outside of an image capturing device is provided.

A third exemplary embodiment will be described with reference to the drawings. A difference between the third exemplary embodiment and the second exemplary embodiment is that an electronic device 40 is equipped with a flexible board 41 instead of the flexible board 32. The electronic device 40 is equipped with a printed circuit board 46 instead of the printed circuit board 16. The electronic device 40 is also equipped with a battery 42. Other basic configurations are similar to the electronic device 30 according to the second exemplary embodiment. A description of portions that are similar to the second exemplary embodiment will be omitted.

Figure 7:
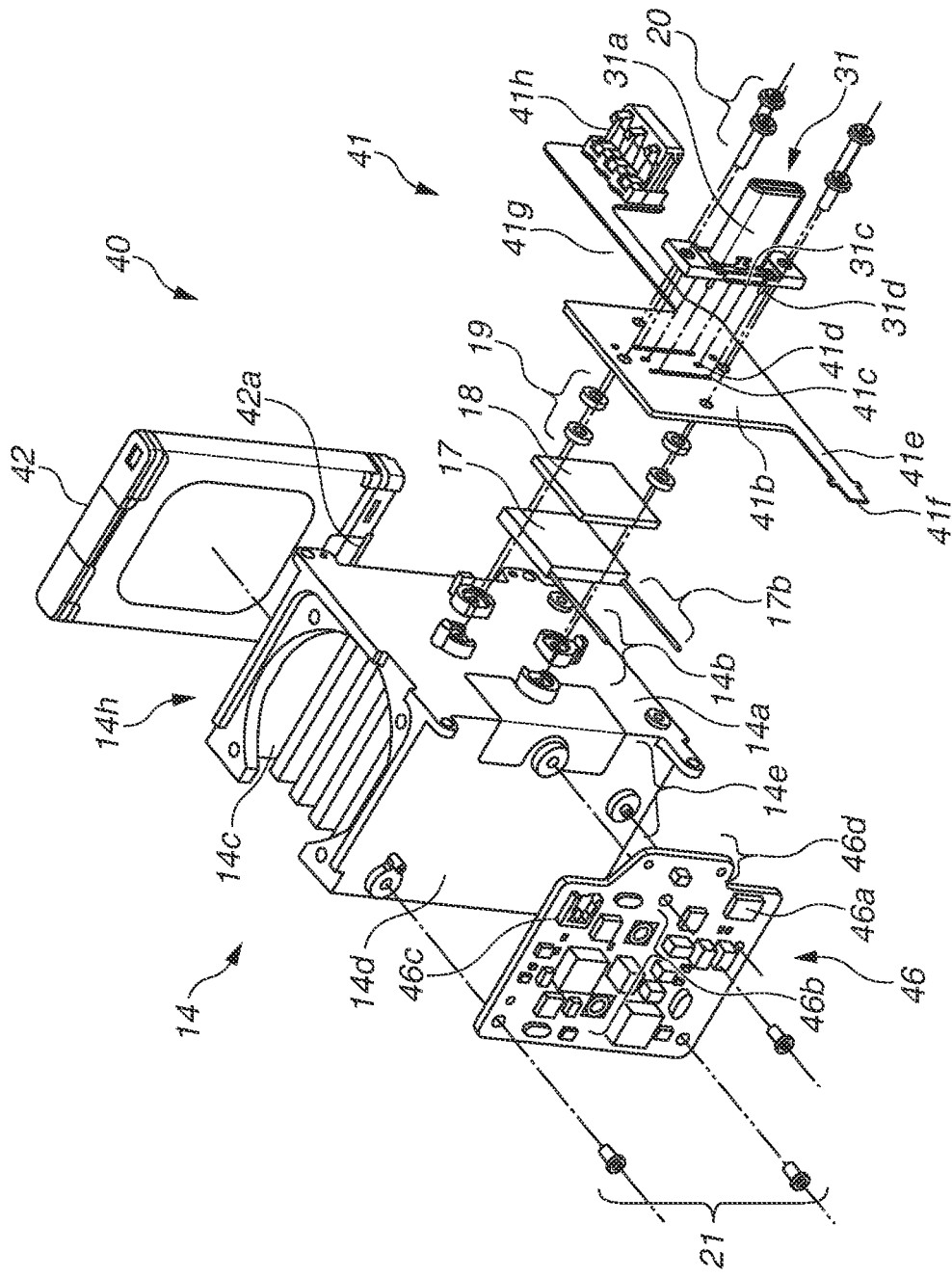
FIG. 7 is a drawing that illustrates an exploded perspective view of an electronic device according to a third exemplary embodiment of the present disclosure.

FIG. 7 is a drawing that illustrates an exploded perspective view of the electronic device 40 according to the present exemplary embodiment.

A fixing portion 14b of a heat dissipation fin 14 includes four screw-fixing holes. A Peltier element 17 and a heat transfer rubber 18 are disposed in an area inside the screw-fixing holes. Further, the flexible board 41 is disposed in the fixing portion 14b of the heat dissipation fin 14 in such a manner that the flexible board 41 is in contact with the heat transfer rubber 18. A plug connector 31 is attached to the flexible board 41. The flexible board 41 mainly includes a copper clad laminate 41a and a reinforcement sheet 41b. Material configurations and the like of the copper clad laminate 41a and the reinforcement sheet 41b are similar to a material configuration and the like of the flexible board 32. To attach the plug connector 31 to the flexible board 41, a surface attachment land 41c and a DIP terminal attachment land 41d are formed. The surface attachment land 41c includes a plurality of conductor pads arrayed at regular intervals. To form the DIP terminal attachment land 41d, first, a plurality of conductor pads is formed in the copper clad laminate 41a. Further, through holes are formed in the conductor pads by punching or the like. The plug connector 31 includes surface attachment terminals 31c electrically connected with a communication terminal of a connection portion 31a, and DIP terminals 31d electrically connected with a metal shell that covers an insulator. The DIP terminals 31d are inserted into through holes of the DIP terminal attachment land 32d, the plug connector 31 is mounted, the lands are electrically connected with the terminals. The flexible board 32 also has four through holes that surround a land portion on which the plug connector 31 is attached. The four through holes correspond to a layout of the screw-fixing holes of the fixing portion 14b of the heat dissipation fin 14. In a state where the Peltier element 17, the heat transfer rubber 18, the flexible board 41, and the plug connector 31 are layered, and are closer to a main face 14a of the heat dissipation fin 14 in this order, four screws 20 are screwed from a through hole side of the flexible board 41 to the screw-fixing holes of the fixing portion 14b, and the Peltier element 17, the heat transfer rubber 18, the flexible board 41, and the plug connector 31 are fixed to and held by the heat dissipation fin 14. Four resin washers 19 are inserted between the reinforcement sheet 41b of the flexible board 41 and the fixing portion 14b of the heat dissipation fin 14.

The heat dissipation fin 14 includes a fixing portion 14e on a side face 14d, and a printed circuit board 46 is fixed and held with three screws 21. A connector 46c is attached to the printed circuit board 46, and is to be electrically connected with a connector 15d of a fan 15 not illustrated. The printed circuit board 46 includes a conductor land 46d. The conductor land 46d has through holes through which ends of terminal portions 17b of the Peltier element 17 can be inserted. The terminal portions 17b are inserted into the conductor land 46d, the printed circuit board 46 is fixed to and held by the heat dissipation fin 14, and the terminal portions 17b are electrically connected with the conductor land 46d by soldering or the like. Various attachment components are attached to the printed circuit board 46, and the printed circuit board 46 actuates and controls the Peltier element 17 and the fan 15 not illustrated. A tactile switch 46b is also attached to the printed circuit board 46. A wiring line pattern that extends from the tactile switch 46b is connected with a circuit that controls the Peltier element 17 and the fan 15 not illustrated. The power supply jack connector 16a described in the first exemplary embodiment is not attached to the printed circuit board 46. Instead, a flexible connector 46a is attached to the printed circuit board 46. The flexible connector 46a is a connector electrically connected with the flexible board 41. The flexible board 41 includes a wiring line arm portion 41e. An end portion of the wiring line arm portion 41e includes a connector connection portion 41f. A part of a conductor layer of the connector connection portion 41f is exposed, and forms a connection terminal shape. The connector connection portion 41f is arrayed at a pin pitch that is similar to a pin pitch of contact terminals disposed in the flexible connector 46a. The connector connection portion 41f has a terminal portion shape that enables connection with the flexible connector 46a, such as an external shape of the flexible connector 46a and a conductor exposure width. The flexible board 41 and the printed circuit board 46 are fixed to and held by the heat dissipation fin 14. Then the connector connection portion 41f is assembled to the flexible connector 46a, and the flexible board 41 is electrically connected with the printed circuit board 46.

The flexible board 41 also includes a wiring line arm portion 41g. A battery connector 41h is attached to an end portion of the wiring line arm portion 41g. The battery connector 41h includes a base housing of heat resistance resin, and a plurality of spring contacts pressed into the base housing. Each of the spring contacts includes a terminal portion that can be attached to the flexible board 41. Each of the terminal portions is electrically connected with the flexible board 41 by soldering or the like. The flexible board 41 is fixed to and held by the fixing portion 14b of the heat dissipation fin 14. Then the wiring line arm portion 41g is bent, and fixed to a side face 14h in such a manner that the battery connector 41h is in contact with the side face 14h. The side face 14h is opposite the side face 14d, and fins 14c of the heat dissipation fin 14 are between the side face 14h and the side face 14d. The battery 42 can be attached to the side face 14h. A battery pack that can be repeatedly charged, such as an alkaline secondary battery or a lithium-ion secondary battery, is used as the battery 42. A terminal portion 42a is formed at the battery 42. When the battery 42 is attached to the heat dissipation fin 14, the terminal portion 42a is electrically connected with the battery connector 41h.

A conductor layer of the flexible board 41 includes a wiring line pattern that electrically connects the battery connector 41h with the connector connection portion 41f. When the flexible board 41, the battery 42, and the printed circuit board 46 are attached to the heat dissipation fin 14, the battery 42 is electrically connected with the printed circuit board 46, and power can be supplied to the fan 15 through the printed circuit board 46. The above configuration enables a cooling operation to be performed without supply of power from the outside through a power supply cable 60. A built-in power supply improves portability. The electronic device 40 can be easily attached to the image capturing device 1 and can be used when, for example, an image is captured outdoors. For this reason, convenience is improved.

Figure 8A:
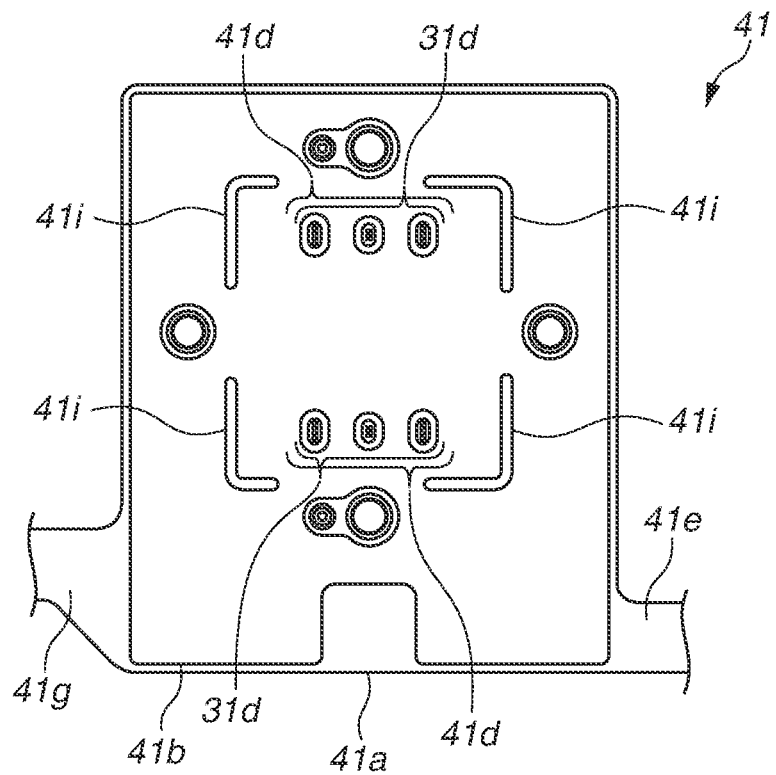
FIGS. 8A and 8B are drawings that illustrate a flexible board according to the third exemplary embodiment of the present disclosure.
Figure 8B:
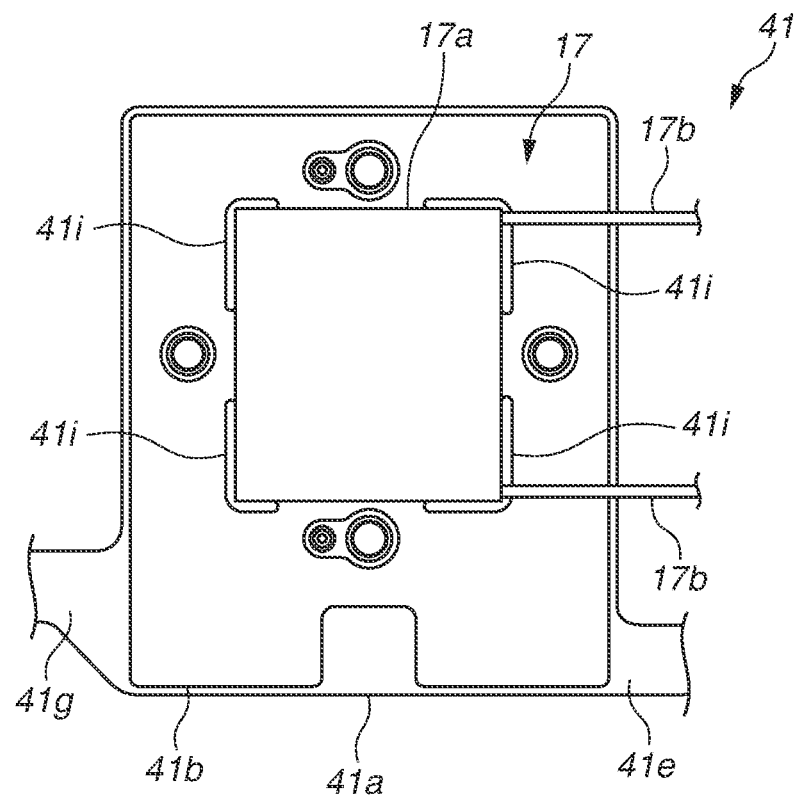

FIGS. 8A and 8B illustrate the flexible board 41 according to the present exemplary embodiment.

FIG. 8A is a front view in which the flexible board 41 is seen from a side of a plane of the reinforcement sheet 41b. FIG. 8B is a drawing of a state in which the Peltier element 17 and the heat transfer rubber 18 are disposed at an attachment position of the flexible board 41. The flexible board 41 is configured by joining the reinforcement sheet 41b to the copper clad laminate 41a, as described above. The reinforcement sheet 41b has through holes at positions that correspond to the DIP terminal attachment land 41d. The DIP terminals 31d can be inserted into the through holes. Through holes are also formed at positions that are opposite the fixing portion 14b when the flexible board 41 is assembled to the heat dissipation fin 14. The screws 20 can be inserted into the through holes. The reinforcement sheet 41b also has a plurality of slits 41i. The slits 41i have shapes that correspond to an external shape of a main-body portion 17a of the Peltier element 17. Providing the slits 41i for the reinforcement sheet 41b increases heat resistance of the reinforcement sheet 41b between an area that is in contact with the Peltier element 17 through the heat transfer rubber 18 and an area that is not in contact with the Peltier element 17. A range where a cooling effect spreads due to an operation of the Peltier element 17 becomes easily limited to an area that is in contact with the heat transfer rubber 18, and the plug connector 31 is more efficiently cooled.

Figure 9A:
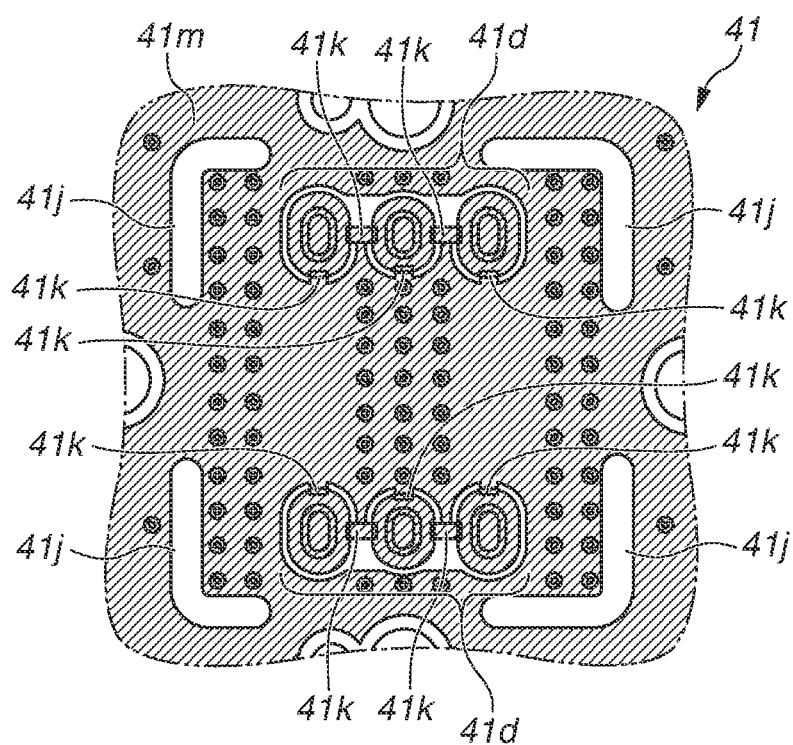
FIGS. 9A and 9B are drawings that illustrate wiring line patterns of conductor layers of the flexible board according to the third exemplary embodiment of the present disclosure.
Figure 9B:
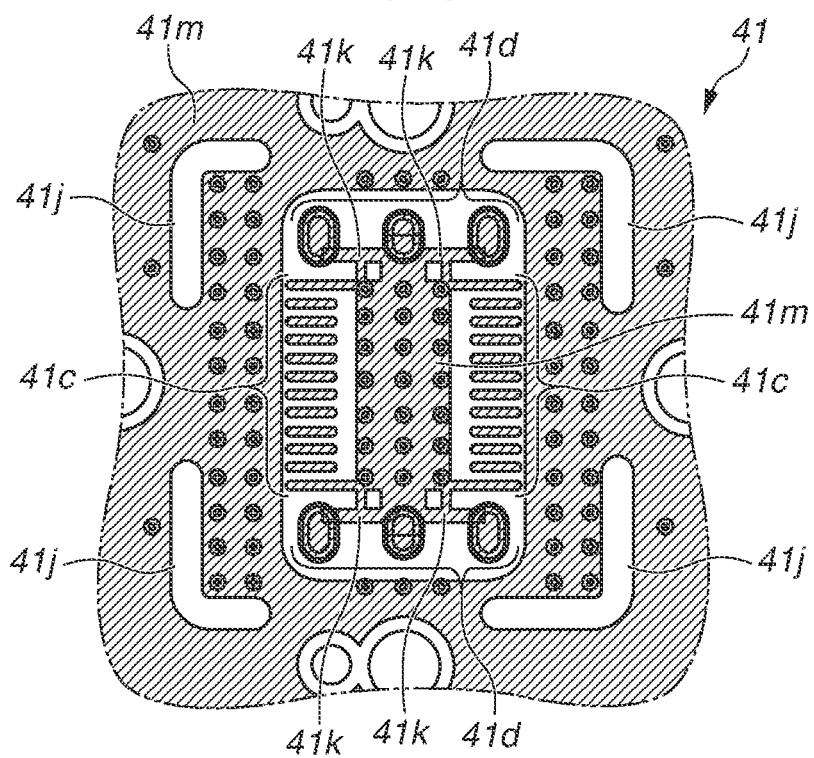

FIGS. 9A and 9B illustrate wiring line patterns of conductor layers of the flexible board 41 according to the present exemplary embodiment.

The flexible board 41 according to the present exemplary embodiment has a both-side flexible layer configuration in which a conductor layer is formed on both sides of a base film. FIG. 9A is a drawing of a wiring line pattern of the flexible board 41, on a side on which the reinforcement sheet 41b is stuck. FIG. 9B is a transparent view in which a wiring line pattern of the flexible board 41 on a side on which the plug connector 31 is mounted is seen from a side of a plane of the reinforcement sheet 41b. As described above, an operation of the Peltier element 17 cools the heat transfer rubber 18 and the flexible board 41, and cools the plug connector 31. In this case, except an area of the flexible board 41 where the DIP terminals 31d are directly in contact with the heat transfer rubber 18, a decrease in a temperature of the heat transfer rubber 18 cools the reinforcement sheet 41b that is in contact with the heat transfer rubber 18, and further a conductor layer on a side on which the reinforcement sheet 41b is stuck is cooled. Further, an effect of a decrease in a temperature of the conductor layer of the flexible board 41 cools the plug connector 31. Conductor layers on both sides of the flexible board 41 have a plurality of slits 41j. The plurality of slits 41j has shapes that correspond to an external shape of a main-body portion 17a of the Peltier element 17. Since the slits 41j are formed in the conductor layers of the flexible board 41, heat resistances of the conductor layers that connect an area that is on top of the main-body portion 17a of the Peltier element 17 in a projection with an area that is not on top of the main-body portion 17a of the Peltier element 17 in a projection increases. A range where a cooling effect of the Peltier element 17 travels to the heat transfer rubber 18 and the reinforcement sheet 41b, and further spreads to the conductor layers is likely to stay in an area where the conductor layers are on top of the main-body portion 17a of the Peltier element 17 in a projection. The plug connector 31 is cooled more efficiently. The flexible board 41 includes the DIP terminal attachment land 41d for attachment of the DIP terminals 31d of the plug connector 31. Attaching the plug connector 31 electrically connects the flexible board 41 with a metal shell that covers an insulator of the plug connector 31. The conductor layers on both sides of the flexible board 41 also include a ground pattern 41m. The ground pattern 41m surrounds the DIP terminal attachment land 41d. The DIP terminal attachment land 41d and the ground pattern 41m are electrically connected with a connection portion 41k. The connection portion 41k is connected with the ground pattern 41m in a direction toward a central direction of the plug connector 31 along a plane of the conductor layer. In FIG. 9B, the connection portion 41k is connected with the ground pattern 41m formed in an area surrounded by the DIP terminal attachment land 41d and the surface attachment land 41c. The connection portion 41k is not disposed in a direction toward the outside of an external shape of the main-body portion 17a of the Peltier element 17 from the plug connector 31 along the plane of the conductor layer of the DIP terminal attachment land 41d. Due to the formation of the ground pattern 41m and the connection portion 41k of the flexible board 41 as described above, heat transferred from a metal shell of the plug connector 31 is concentratedly transferred to the conductor layer directly under the plug connector 31. As similarly as the slits 41j described above, a range where a cooling effect travels to the conductor layers due to an operation of the Peltier element 17 is likely to stay in an area where the conductor layers are on top of the main-body portion 17a of the Peltier element 17 in a projection. The plug connector 31 is cooled more efficiently.

According to the third exemplary embodiment, convenience of an electronic device for cooling an image capturing device is increased due to a structure that contains a battery.

A fourth exemplary embodiment will be described with reference to the drawings. A difference between the present exemplary embodiment and the second exemplary embodiment is that a heat dissipation fin 54 is provided instead of the heat dissipation fin 14, and a flexible board 52 is provided instead of the flexible board 32. Other basic configurations are similar to the electronic device 30 according to the second exemplary embodiment. A description of portions that are similar to the second exemplary embodiment will be omitted.

Figure 10A:
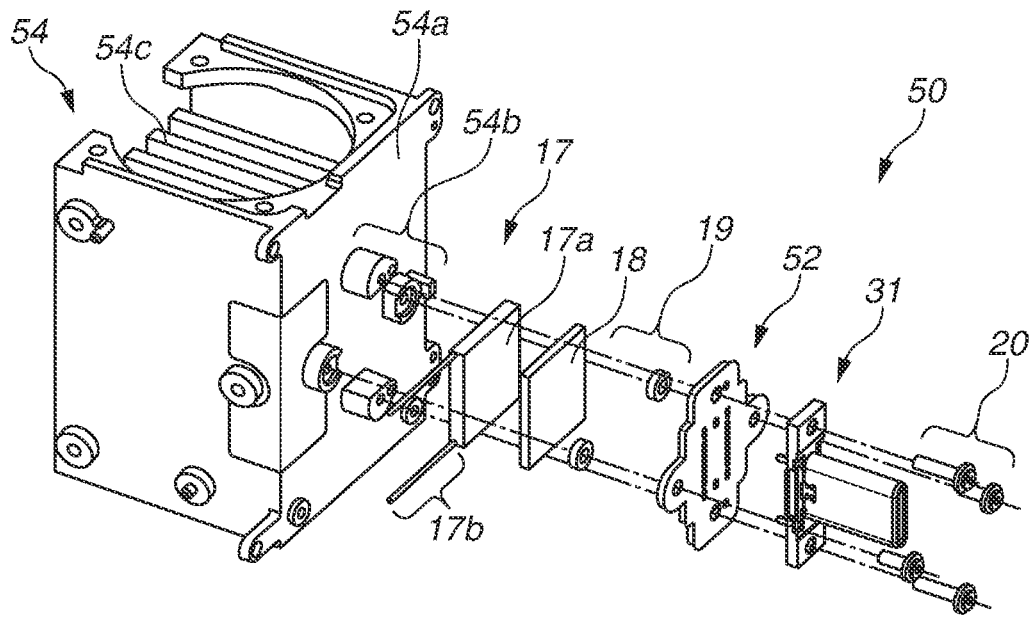
FIGS. 10A and 10B are drawings that illustrate exploded perspective views of an electronic device according to a fourth exemplary embodiment of the present disclosure.
Figure 10B:
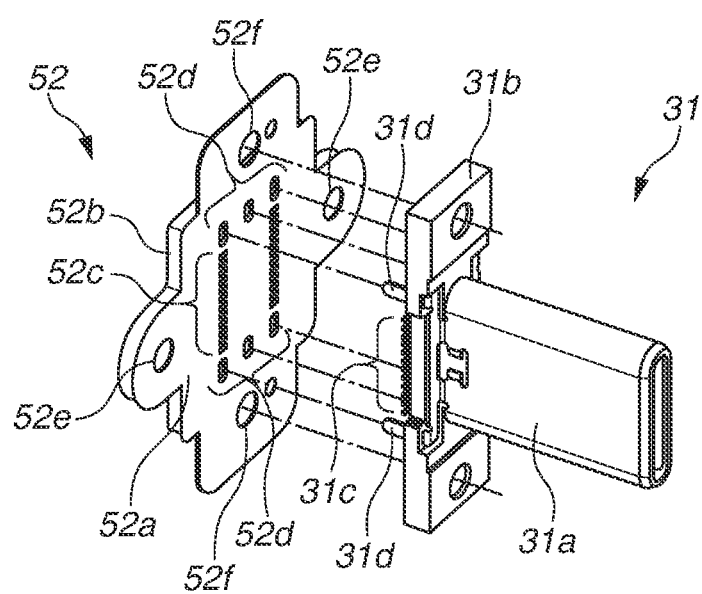

FIGS. 10A and 10B are drawings that illustrate exploded perspective views of an electronic device 50 according to the present exemplary embodiment. A fixing portion 54b of the heat dissipation fin 54 includes four screw-fixing holes. A Peltier element 17 is disposed in an internal area surrounded by the fixing portion 54b. Heat transfer rubber 18 is disposed in such a manner that the heat transfer rubber 18 is in contact with a main-body portion 17a of the Peltier element 17. Further, the flexible board 52 is disposed in such a manner that the flexible board 52 is in contact with the heat transfer rubber 18. A plug connector 31 is attached to the flexible board 52. The flexible board 52 mainly includes a copper clad laminate 52a and a reinforcement sheet 52b. Material configurations and the like of the copper clad laminate 52a and the reinforcement sheet 52b are similar to a material configuration and the like of the flexible board 32 according to the second exemplary embodiment. To attach the plug connector 31 to the flexible board 52, a surface attachment land 52c and a DIP terminal attachment land 52d are formed on the flexible board 52. The surface attachment land 52c includes a plurality of conductor pads arrayed at regular intervals. To form the DIP terminal attachment land 52d, first, a plurality of conductor pads is formed in the copper clad laminate 52a. Further, through holes are formed in the conductor pads by punching or the like. The plug connector 31 includes surface attachment terminals 31c electrically connected with a communication terminal of a connection portion 31a, and DIP terminals 31d electrically connected with a metal shell that covers an insulator. The DIP terminals 31d are inserted into through holes of the DIP terminal attachment land 52d, the plug connector 31 is mounted, and the lands are electrically connected with the terminals. The flexible board 52 also has four through holes that surround a land portion on which the plug connector 31 is attached. The four through holes correspond to a layout of the screw-fixing holes of the fixing portion 54b of the heat dissipation fin 54. In a state where the Peltier element 17, the heat transfer rubber 18, the flexible board 52, and the plug connector 31 are layered, and are closer to a main face 54a of the heat dissipation fin 54 in this order, four screws 20 are screwed from a through hole side of the flexible board 52 to the screw-fixing holes of the fixing portion 54b, and the Peltier element 17, the heat transfer rubber 18, the flexible board 52, and the plug connector 31 are fixed to and held by the heat dissipation fin 54. In this case, two resin washers 19 are inserted between the reinforcement sheet 52b of the flexible board 52 and the fixing portion 54b of the heat dissipation fin 54. The electronic device 50 also includes the containing case 12, the cover 13, the fan 15, the printed circuit board 16, and the like that have been described in the first exemplary embodiment. The features and shapes of the components are similar to the first exemplary embodiment.

The four through holes formed through the flexible board 52 are classified into two thick-sheet through holes 52e that are close to the surface attachment land 52c, and two thin-sheet through holes 52f that are close to the DIP terminal attachment land 52d. The thick-sheet through holes 52e are through holes formed through an area where the copper clad laminate 52a is stuck to the reinforcement sheet 52b. The thin-sheet through holes 52f are through holes formed through only the copper clad laminate 52a because the reinforcement sheet 52b is cut. When the flexible board 52 is fixed to and held by the heat dissipation fin 54 with the screws 20, two components that include the heat dissipation fin 54 and the flexible board 52 are screwed together with the screws 20 that pass the thick-sheet through holes 52e. When the plug connector 31 is attached to the flexible board 52, the base portion 31b is in contact with the thin-sheet through holes 52f, and two through holes formed through the base portion 31b are disposed at positions that are opposite the thin-sheet through holes 52f. When the flexible board 52 is fixed to the heat dissipation fin 54 with the screws 20 that pass the thin-sheet through holes 52f, the base portion 31b, the heat dissipation fin 54, and the flexible board 52 between the base portion 31b and the heat dissipation fin 54 are screwed together. Resin washers 19 are disposed at portions of the fixing portion 54b that are opposite the thick-sheet through holes 52e. Resin washers 19 are not disposed at portions of the fixing portion 54b that are opposite the thin-sheet through holes 52f. The reinforcement sheet 52b of the flexible board 52 is shaped as described above. Consequently, the number of the resin washers 19 is decreased. The configuration described above also contributes to strength of the plug connector 31. In this case, however, heat transferred from a heat generation plane of the Peltier element 17 to the heat dissipation fin 54 may become likely to be transferred to a heat absorption plane side of the Peltier element 17 through the fixing portion 54b and the copper clad laminate 52a around the thin-sheet through holes 52f. Accordingly, an effect of an operation of the Peltier element 17 that decreases an increase in a temperature decreases. For this reason, at least a conductor layer of the copper clad laminate 52a of the flexible board 52 in an area that is opposite the fixing portion 54b is removed relative to surroundings of the thin-sheet through holes 52f. In the copper clad laminate 52a opposite the fixing portion 54b, only an insulation layer, such as a base film, that has a heat conductivity that is higher than a heat conductivity of the conductor layer, and an adhesive layer that sticks the insulation layer to the conductor layer are layered. Since only the adhesive layer is layered, heat travel from the heat dissipation fin 54 to a heat absorption plane side of the Peltier element 17 through the flexible board 52 is restricted. Further, the base portion 31b with which head bearing surfaces of the screws 20 are in contact is a material such as a heat resistance resin, as described above. These resin materials include materials that have heat conductivities that are lower than a heat conductivity of a conductor layer, such as copper foil. Accordingly, heat travel from the heat dissipation fin 54 to the plug connector 31 and a heat absorption plane side of the Peltier element 17 through the screws 20 is restricted. For this reason, the flexible board 52 and the heat dissipation fin 54 that are configured as in the electronic device 50 restrict heat travel from the heat dissipation fin 54 to a heat absorption plane side of the Peltier element 17, and reduce the number of components of the resin washers 19. Further, the reinforcement sheet 52b made of metal is downsized, and a weight of the electronic device 50 is decreased. For example, a conductor layer may be removed from an area of a thick-sheet through hole 52e portion of the copper clad laminate 52a that is in contact with head bearing surfaces of the screws 20. Such a configuration restricts heat travel from the heat dissipation fin 54 to a heat absorption plane side of the Peltier element 17 through the screws 20. Consequently, a cooling effect of the Peltier element 17 acts more efficiently.

According to the present exemplary embodiment, a change of positions of the resin washers 19, and the like, reduce the number of the resin washers 19, and further decrease a weight of the electronic device 50, relative to the second exemplary embodiment.

The present disclosure is not limited to the above-described exemplary embodiments, but may be implemented with the shapes variously changed.

Figure 11A:
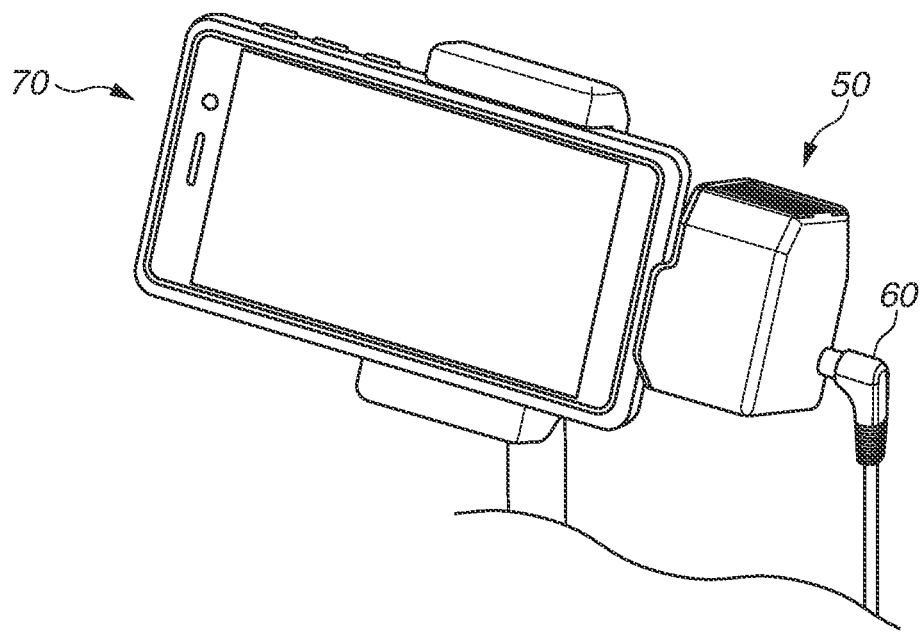
FIGS. 11A and 11B are drawings that illustrate other application examples of an electronic device according to the present disclosure.
Figure 11B:
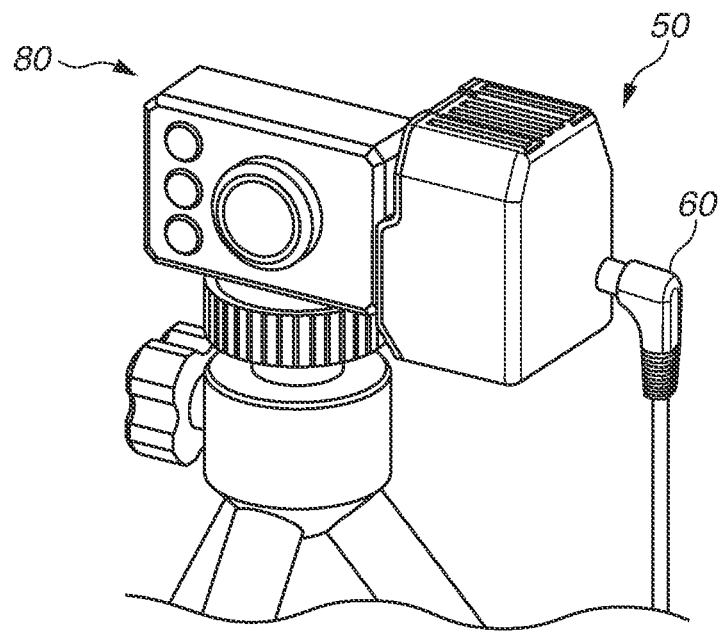

FIGS. 11A and 11B illustrate other application examples of an electronic device 50 according to the present disclosure. FIG. 11A illustrates an example of an electronic device 50 to be attached to a mobile phone. FIG. 11B illustrates an example of an electronic device 50 to be attached to an action cam. FIGS. 11A and 11B illustrate a fact that the electronic device 50 can be connected with a connection portion of an external interface of a smartphone 70, and can be connected with a connection portion of an external interface of an action cam 80. Such application examples are not limited to the electronic device 50, but the electronic devices 10, 30, and 40 according to other exemplary embodiments described above can be applied. A heat dissipation device according to the present disclosure is connected with various electronic devices that include a receptacle connector of a general-purpose interface. Consequently, phenomena in which an operation of each of the electronic devices is restricted due to an increase in a temperature in the electronic device are prevented. Even if a mobile phone does not perform an image capturing function, such usage as illustrated in FIG. 11A is possible when cooling is necessary. A combination of the electronic devices described above and an external device can be used as an electronic device system that has a cooling function and provides various functions in addition to an image capturing function, as described above.

The above-described exemplary embodiments are only representations of concrete examples of implementation of the present disclosure. A technical scope of the present disclosure should not be limitedly interpreted from the above-described exemplary embodiments. That is to say, the present disclosure can be implemented in various forms without departing from a technical idea or a main feature of the present disclosure. For example, a shape change example in which a configuration of the conductor layers of the flexible board 41, such as the slits 41j and the connection portion 41k that have been described in the third exemplary embodiment, is applied to the flexible board 32 or the flexible board 52 is conceivable. For example, a shape change example in which a configuration that has been described in the fourth exemplary embodiment and decreases the number of components of the resin washers 19 is applied to a configuration of the electronic device 40 is conceivable.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An electronic device comprising:
an interface unit including a connection portion attached to an external device by being connected with an interface terminal disposed in the external device, the interface terminal having a receptacle structure, a pin jack structure, or a female structure, the interface unit having a header structure, a plug structure, or a male structure, the interface unit being a connector structure including an electronic contact portion engaged with the interface terminal and electrically connected with the interface terminal, the interface unit including a circuit board to which the connector structure is attached and including a conductor and an insulation layer, the circuit board including a pad portion that is a part of the conductor exposed to an outside, the electronic contact portion including a contact terminal portion connected with the interface terminal and an attachment terminal portion contacting the pad portion and attached to the pad portion, and the connector structure is being attached to the circuit board, in a state where the attachment terminal portion is electrically connected with the pad portion;
a heat transfer unit; and
a heat dissipation unit,
wherein the heat transfer unit and the heat dissipation unit are connected with the interface unit, and are in a direction opposite the external device when the interface unit is connected with the external device.

2. The electronic device according to claim 1, wherein the heat dissipation unit, the heat transfer unit, and the interface unit are disposed in order of (1) the heat dissipation unit; (2) the heat transfer unit; (3) the interface unit.

3. The electronic device according to claim 1, wherein the circuit board includes a flexible board.

4. The electronic device according to claim 1,
wherein the circuit board has a through hole,
wherein the connector structure includes a dual in-line package (DIP) terminal, and
wherein the DIP terminal projects into the heat transfer unit beyond the through hole, in an orientation in which the connector structure is attached to the circuit board.

5. The electronic device according to claim 4, further comprising an elastic heat transfer unit,
wherein the elastic heat transfer unit is disposed between the heat transfer unit and the interface unit.

6. The electronic device according to claim 5, wherein when the connector structure is attached to the circuit board, the DIP terminal is in contact with the elastic heat transfer unit or presses the elastic heat transfer unit.

7. The electronic device according to claim 4, wherein at least a part of the conductor that is around the through hole and is on a side of the circuit board close to the heat dissipation unit is absent.

8. The electronic device according to claim 4, wherein the circuit board includes a reinforcement sheet, and the reinforcement sheet is absent at the through hole.

9. The electronic device according to claim 1, wherein the heat dissipation unit includes a fan.

10. The electronic device according to claim 9, wherein the fan contains a battery configured to supply power.

11. The electronic device according to claim 1,
wherein the heat dissipation unit includes a heat dissipation fin, and
wherein the heat dissipation fin is disposed orthogonal to the heat transfer unit.

12. The electronic device according to claim 1, further comprising a duct unit configured to form a flow path that passes the heat dissipation unit,
wherein the flow path is in a direction parallel to the heat transfer unit.

13. The electronic device according to claim 1, wherein the external device is an image capturing device.

14. An electronic device comprising: an external device, wherein
the electronic device comprises an interface unit including a connection portion attached to the external device by being connected with an interface terminal disposed in the external device; a heat transfer unit; and a heat dissipation unit,
and, the heat transfer unit and the heat dissipation unit are connected with the interface unit, and are in a direction opposite the external device when the interface unit is connected with the external device,
wherein the interface terminal has a receptacle structure, a pin jack structure, or a female structure, the interface unit has a header structure, a plug structure, or a male structure, the interface unit is a connector structure including an electronic contact portion engaged with the interface terminal and electrically connected with the interface terminal, the interface unit includes a circuit board to which the connector structure is attached and including a conductor and an insulation layer, the circuit board includes a pad portion that is a part of the conductor exposed to an outside, the electronic contact portion includes a contact terminal portion connected with the interface terminal and an attachment terminal portion contacting the pad portion and attached to the pad portion, and the connector structure is attached to the circuit board, in a state where the attachment terminal portion is electrically connected with the pad portion.

* * * * *